(12) United States Patent
Lin et al.

(10) Patent No.: US 10,121,432 B2
(45) Date of Patent: Nov. 6, 2018

(54) SHIFT REGISTER AND DISPLAY DEVICE (71) Applicants: HannStar Display (Nanjing) Corporation, Nanjing (CN); HannStar Display Corporation, Taipei (TW)

(72) Inventors: Sung-Chun Lin, Taipei (TW); Hsuan-Chen Liu, Taipei (TW); Chien-Ting Chan, Taipei (TW)

(73) Assignees: HANNSTAR DISPLAY (NANJING) CORPORATION, Nanjing (CN); HANNSTAR DISPLAY CORPORATION, Taipei (TW)

( * ) Notice: Subject to any disclaimer, the term of this patent is extended or adjusted under 35 U.S.C. 154(b) by 96 days.

(21) Appl. No.: 15/242,765

(22) Filed: Aug. 22, 2016

(65) Prior Publication Data

US 2017/0061911 A1    Mar. 2, 2017

(30) Foreign Application Priority Data

Sep. 2, 2015 (CN) .......................... 2015 1 0557310

(51) Int. Cl.
*G09G 3/36* (2006.01)
*G11C 19/28* (2006.01)

(52) U.S. Cl.
CPC .......... *G09G 3/3655* (2013.01); *G09G 3/3688* (2013.01); *G09G 3/3696* (2013.01); *G11C 19/28* (2013.01); *G09G 3/36* (2013.01); *G09G 2300/0426* (2013.01); *G09G 2310/0286* (2013.01); *G09G 2310/0289* (2013.01); *G09G 2310/08* (2013.01)

(58) Field of Classification Search
CPC ... G09G 2300/0426; G09G 2310/0286; G09G 2310/0289; G09G 2310/08; G09G 3/3655; G09G 3/3688; G09G 3/3696
See application file for complete search history.

(56) References Cited

U.S. PATENT DOCUMENTS

2014/0055333 A1* 2/2014 Lin ..................... G09G 3/3611
                                                           345/100
2014/0362067 A1* 12/2014 Wang .................. G09G 3/3677
                                                           345/208

\* cited by examiner

*Primary Examiner* — Towfiq Elahi
(74) *Attorney, Agent, or Firm* — McClure, Qualey & Rodack, LLP (57) ABSTRACT

A shift register includes a primary circuit and a secondary circuit including an inverting circuit and a pull-down circuit. The pull-down circuit includes a first transistor. The primary circuit has an output terminal, a first and a second input terminals, and is electrically connected to a first common terminal. The secondary circuit is electrically connected to the first common terminal. The pull-down circuit is electrically connected to the inverting circuit. The first transistor has a first top gate, a first bottom gate, a first first electrode and a first second electrode, wherein the first second electrode is configured to receive a first voltage level, the first top gate is configured to receive a second voltage level, and the second voltage level is higher than the first voltage level.

16 Claims, 8 Drawing Sheets

SHIFT REGISTER AND DISPLAY DEVICE

CROSS REFERENCE TO RELATED APPLICATION

This application claims the benefit of the Patent Application No. CN 201510557310.8, filed on Sep. 2, 2015, at the China State Intellectual Property Office, the disclosures of which are incorporated herein in their entirety by reference.

TECHNICAL FIELD

Embodiments in the present disclosure are related to a thin film transistor (TFT) technology, more particularly to an improvement of a bi-directional shift register, where its purpose is to compensate a threshold voltage of the TFT, and improve an unstable phenomenon of the threshold voltage shift (Vth Shift) of the TFT.

BACKGROUND

An amorphous silicon thin film transistor (TFT) is generally used as an integrated component in a scan shift circuit, and some amorphous silicon TFT elements have a threshold voltage shift (Vth Shift) of instability. With increased time in use, the degree of the threshold voltage shift will seriously affect the normal operation of the scan shift circuit, and finally, even the scan shift circuit will fail.

Nowadays, shift register circuits constructed by the amorphous silicon TFTs will face the condition with increasing time in use, so as to generate the threshold voltage shift phenomenon. With the increase in the severity of the offset, it will also affect the normal operation of the circuit, and even cause the circuit to fail.

SUMMARY OF EXEMPLARY EMBODIMENTS

In order to solve the drawback in the prior art, the present invention discloses a shift register and a display device to efficiently improve the above drawback. The present invention solves the issue that the generation of the threshold voltage shift phenomenon with increased time in use affects the normal operation of the circuit. Meanwhile, the embodiments in the present invention are easily implemented, and therefore have industrial applicability.

In accordance with one embodiment of the present disclosure, a display device is disclosed. The display device includes a display panel and a shift register device including at least one shift register unit including a primary circuit and a secondary circuit. The secondary circuit includes an inverting circuit and a pull-down circuit including a first, a second, a third and a fourth transistors. The shift register device is configured to drive the display panel. The primary circuit has an output terminal, a first and a second input terminals, and a first common terminal. The secondary circuit is electrically connected to the first common terminal. The pull-down circuit is electrically connected to the inverting circuit. The first transistor has a first top gate, a first bottom gate, a first first electrode and a first second electrode. The second transistor has a second top gate, a second bottom gate, a second first electrode and a second second electrode. The third transistor has a third top gate, a third bottom gate, a third first electrode and a third second electrode. The fourth transistor has a fourth top gate, a fourth bottom gate, a fourth first electrode and a fourth second electrode.

In accordance with one embodiment of the present disclosure, a pixel structure for a liquid crystal display (LCD) panel is disclosed. The shift register includes a primary circuit and a secondary circuit including an inverting circuit and a pull-down circuit. The pull-down circuit includes a first, a second, a third and a fourth transistors. The primary circuit has an output terminal, a first and a second input terminals, and is electrically connected to a first common terminal. The secondary circuit is electrically connected to the first common terminal. The pull-down circuit is electrically connected to the inverting circuit. The first transistor has a first top gate, a first bottom gate, a first first electrode and a first second electrode. The second transistor has a second top gate, a second bottom gate, a second first electrode and a second second electrode. The third transistor has a third top gate, a third bottom gate, a third first electrode and a third second electrode. The fourth transistor has a fourth top gate, a fourth bottom gate, a fourth first electrode and a fourth second electrode.

In accordance with a further embodiment of the present disclosure, the present invention discloses a shift register. The shift register includes a primary circuit and a secondary circuit including an inverting circuit and a pull-down circuit. The pull-down circuit includes a first transistor. The primary circuit has an output terminal, a first and a second input terminals, and is electrically connected to a first common terminal. The secondary circuit is electrically connected to the first common terminal. The pull-down circuit is electrically connected to the inverting circuit. The first transistor has a first top gate, a first bottom gate, a first first electrode and a first second electrode, wherein the first second electrode is configured to receive a first voltage level, the first top gate is configured to receive a second voltage level, and the second voltage level is higher than the first voltage level.

Based on the technical schemes disclosed with the preferred embodiments of the present invention, the shift register and the display device of the present invention at least have the following advantageous efficacies: it can suppress the threshold voltage shift, and has variety advantages of long usage life, good stability and satisfying the requirements for a high resolution panel.

The above embodiments and advantages of the present invention will become more readily apparent to those ordinarily skilled in the art after reviewing the following detailed descriptions and accompanying drawings.

BRIEF DESCRIPTION OF THE DRAWINGS

FIG. 4(*a*) shows a shift register set according to the preferred embodiment of the present disclosure;

FIG. 4(*b*) shows a first shift register according to the preferred embodiment of the present disclosure;

FIG. 4(*c*) shows a second shift register according to the preferred embodiment of the present disclosure;

FIG. 4(*d*) shows a third shift register according to the preferred embodiment of the present disclosure; and FIG. 4(*e*) shows a driving wave set according to the preferred embodiment of the present disclosure.

DETAILED DESCRIPTION OF THE PREFERRED EMBODIMENTS

The present invention can be fully understood through the following embodiments, and the skilled person in the art can complete it accordingly. However, the skilled person in the art knows that the present invention can be implemented without one or a plurality of specific details. The specific embodiment in the following text shows an example embodiment, which is merely for demonstration, rather than restriction. All the technical features disclosed in the specification, all the disclosed method or steps in the process can be combined with each other in any way, except contradicting features and/or steps.

Figure 1:
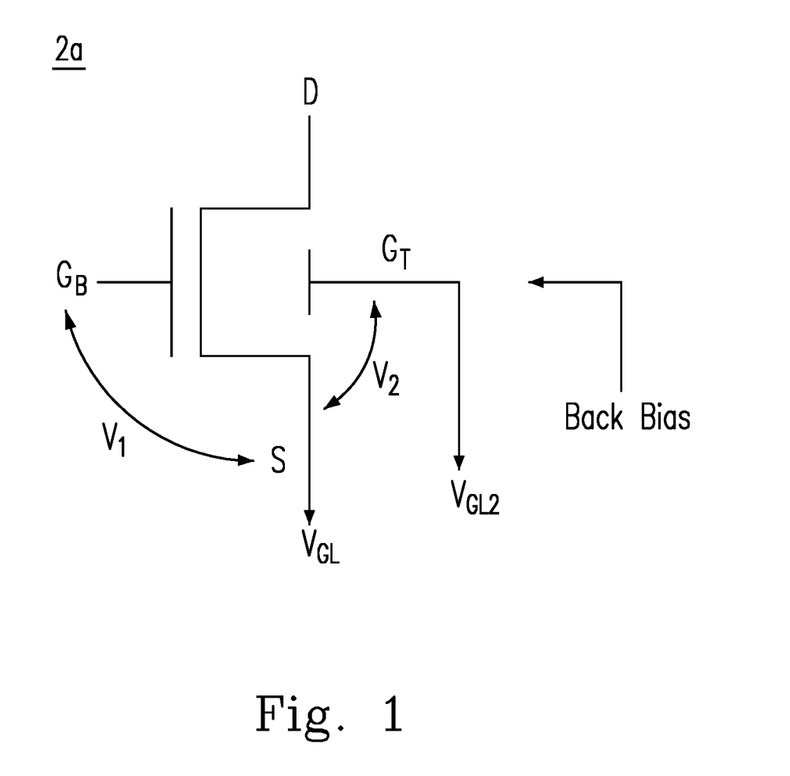
FIG. 1 shows a transistor according to the preferred embodiment of the present disclosure.

Please refer to FIG. 1, which shows a transistor 2a according to the preferred embodiment of the present disclosure. The transistor 2a has a bottom gate $G_B$, a top gate $G_T$, a first electrode D and a second electrode S. The bottom gate $G_B$ has a bottom gate voltage VGB, the top gate $G_T$ has a top gate voltage $V_{GT}$, the second electrode S has a second electrode voltage $V_S$, the bottom gate $G_B$ and the second electrode S have a first voltage $V_1$ therebetween, and the top gate $G_T$ and the second electrode S have a second voltage $V_2$ therebetween. According to FIG. 1, the upper side terminal of the field effect transistor is identified as the first electrode D, the middle left terminal is identified as the bottom gate $G_B$, the middle right is identified as the top gate $G_T$, and the lower side terminal is identified as the second electrode S. The top gate $G_T$ is used for a back bias.

In FIG. 1, the top gate $G_T$ is disposed opposite to the corresponding bottom gate $G_B$, so that the threshold voltage of the transistor 2a can be compensated through the back bias of the top gate $G_T$. In the LCD display, a driving voltage of a general gate driver is equal to 15 volts at the bottom gate voltage VGB, and is equal to −10 volts at the second electrode $V_S$. In one preferred embodiment, the second electrode voltage $V_S$ has a first voltage level $V_{GL}$, and the top gate voltage $V_{GT}$ has a second voltage level $V_{GL2}$, wherein the second voltage level $V_{GL2}$ is higher than the first voltage level $V_{GL}$.

In FIG. 1, an unstable phenomenon of the threshold voltage shift (Vth Shift) is produced in the transistor 2a because there is a situation that the first voltage $V_1$ is higher than zero for a long time. In order to improve the unstable phenomenon, in the preferred embodiment, the top gate $G_T$ is employed to generate a function of the back bias. For example, the bottom gate voltage $V_{GB}$ is equal to 15 volts and the second electrode voltage $V_S$ is equal to −10 volts, therefore the first voltage $V_1$ can be calculated to be equal to 25 volts, which is higher than zero, and this indicates that the transistor 2a will generate a threshold voltage variation. The method of improvement includes causing the second voltage V2 to be higher than zero, so that the top gate voltage $V_{GT}$ can be biased to be higher than the second electrode voltage $V_S$. For example, when the top gate voltage $V_{GT}$ is equal to −8 volt, the second voltage V2 is caused to be (−8)−(−10)=2 volts, which is a positive voltage to suppress the threshold voltage shift.

Figure 2:
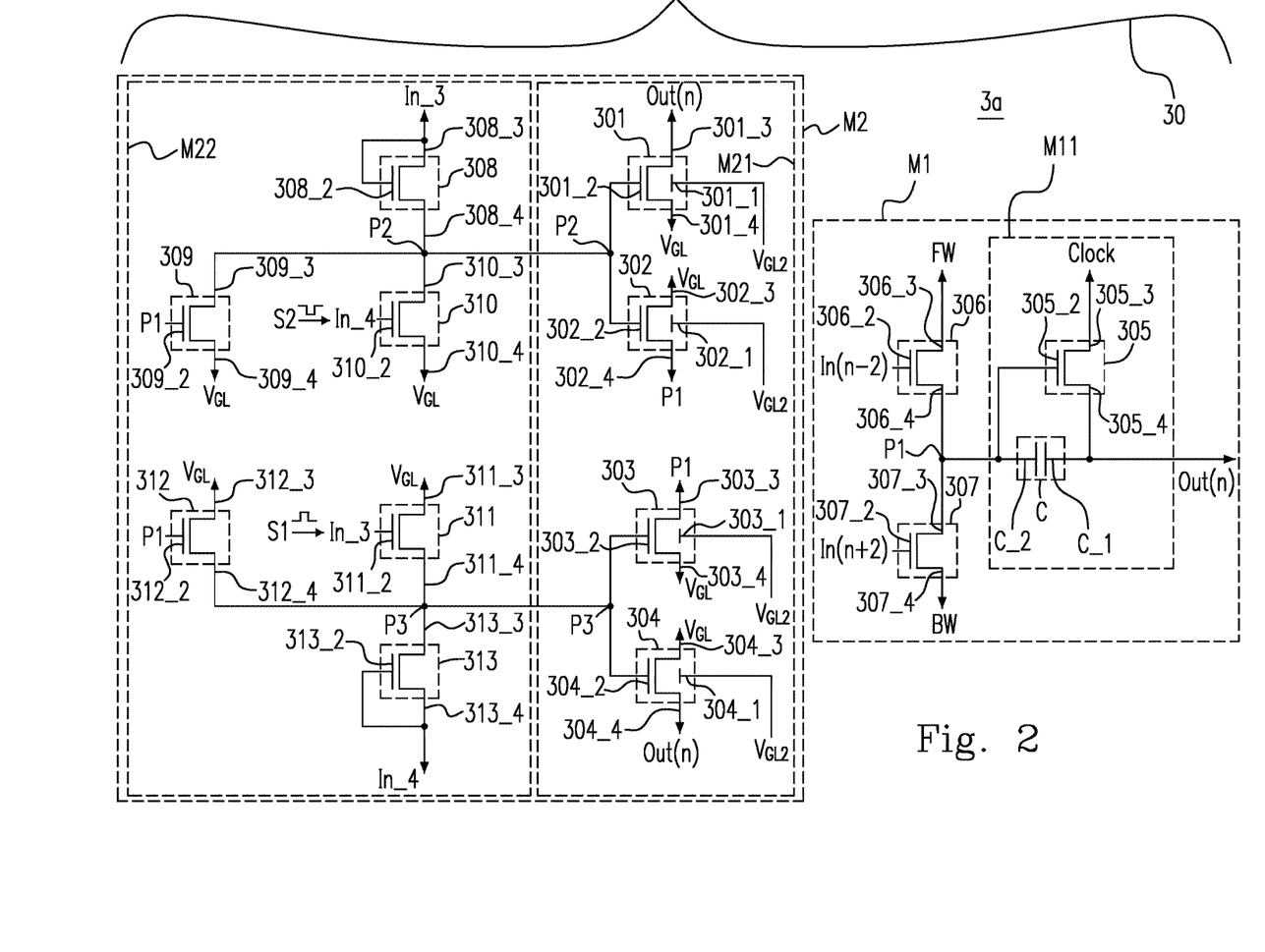
FIG. 2 shows a shift register according to the referred embodiment of the present disclosure.

Please refer to FIG. 2, which shows a shift register 3a according to the preferred embodiment of the present disclosure. The shift register 3a includes a primary circuit M1 and a secondary circuit M2. The primary circuit M1 has an output terminal Out(n), a first input terminal In(n−2) and a second input terminal In(n+2), and is electrically connected to the secondary circuit M2 through a first common terminal P1. The secondary circuit M2 includes an inverting circuit M22 and a pull-down circuit M21 electrically connected to the inverting circuit M22. The pull-down circuit M21 includes a first transistor 301, a second transistor 302, a third transistor 303 and a fourth transistor 304. The first transistor 301 has a first top gate 301_1, a first bottom gate 301_2, a first first electrode 301_3 and a first second electrode 301_4; the second transistor 302 has a second top gate 302_1, a second bottom gate 302_2, a second first electrode 302_3 and a second second electrode 302_4; the third transistor 303 has a third top gate 303_1, a third bottom gate 303_2, a third first electrode 303_3 and a third second electrode 303_4; and the fourth transistor 304 has a fourth top gate 304_1, a fourth bottom gate 304_2, a fourth first electrode 304_3 and a fourth second electrode 304_4.

In FIG. 2, the secondary circuit M2 is electrically connected to the primary circuit M1 through the first common terminal P1. The first bottom gate 301_2 is electrically connected to the second bottom gate 302_2 through a second common terminal P2; the third bottom gate 303_2 is electrically connected to the fourth bottom gate 304_2 through a third common terminal P3; each of the first first electrode 301_3 and the fourth second electrode 304_4 is electrically connected to the output terminal Out(n); each of the second second electrode 302_4 and the third first electrode 303_3 is electrically connected to the first common terminal P1; each of the first second electrode 301_4, the second first electrode 302_3, the third second electrode 303_4 and the fourth first electrode 304_3 is configured to receive a first signal having the first voltage level $V_{GL}$; and each of the first top gate 301_1, the second top gate 302_1, the third top gate 303_1 and the fourth top gate 304_1 is configured to receive a second signal having the second voltage level $V_{GL2}$.

When the second voltage level $V_{GL2}$ is higher than the first voltage level $V_{GL}$, threshold voltages of the first transistor 301, the second transistor 302, the third transistor 303 and the fourth transistor 304 can be adjusted accordingly. In one preferred embodiment, the shift register 3a is a nth stage driving module 30, wherein n>2. The input signal of the first input terminal In(n−2) is one of output signals from the output terminals Out(n) of a first previous stage or a second previous stage, i.e., the preceding two shift register of the nth stage shift register 3a. The input signal of the second input terminal In(n+2) is one of output signals from the output terminals Out(n) of a first next stage or a second next stage, i.e., the next two shift registers thereof the nth stage shift register 3a.

In FIG. 2, the primary circuit M1 further includes a pull-up circuit M11, a sixth transistor 306 and a seventh transistor 307. The pull-up circuit M11 includes a fifth transistor 305 and a capacitor C. The fifth transistor 305 has a fifth bottom gate 305_2, a fifth first electrode 305_3 and a fifth second electrode 305_4. The fifth bottom gate 305_2 is electrically connected to the first common terminal P1, the fifth first electrode 305_3 receives clock signal, and the fifth second electrode 305_4 is electrically connected to the output terminal Out(n).

The first connecting terminal C_1 of the capacitor C is electrically connected to the output terminal Out(n), and the second connecting terminal C_2 is electrically connected to the first common terminal P1. The sixth transistor 306 has a sixth bottom gate 306_2, a sixth first electrode 306_3 and a sixth second electrode 306_4, wherein the sixth bottom gate 306_2 is electrically connected to the first input terminal In(n−2), the sixth first electrode 306_3 receives a forward bias voltage FW, and the sixth second 306_4 is electrically connected to the first common terminal P1.

The seventh transistor 307 has a seventh bottom gate 307_2, a seventh first electrode 307_3 and a seventh second electrode 307_4, wherein the seven bottom gate 307_2 is electrically connected to the second input terminal In(n+2), the seventh first electrode 307_3 is electrically connected to the first common terminal P1, and the seventh second 307_4 receives a reverse bias voltage BW.

In FIG. 2, the inverting circuit M22 further includes an eighth transistor 308, a ninth transistor 309, a tenth transistor 310, an eleventh transistor 311, a twelfth transistor 312 and a thirteenth transistor 313. The eighth transistor 308 has an eighth bottom gate 308_2, an eighth first electrode 308_3 and an eighth second electrode 308_4, wherein each of the eighth bottom gate 308_2 and the eighth first electrode 308_3 is electrically connected to a third input terminal In_3, and the eighth second electrode 308_4 is electrically connected to the second common terminal P2. The ninth transistor 309 has a ninth bottom gate 309_2, a ninth first electrode 309_3 and a ninth second electrode 309_4, wherein the ninth bottom gate 309_2 is electrically connected to the first common terminal P1, the ninth first electrode 309_3 is electrically connected to the second common terminal P2, and the ninth second 309_4 is configured to receive the first signal having the first voltage level $V_{GL}$. The tenth transistor 310 has a tenth bottom gate 310_2, a tenth first electrode 310_3 and a tenth second electrode 310_4, wherein the tenth bottom gate 310_2 is electrically connected to a fourth input terminal In_4, the tenth first electrode 310_3 is electrically connected to the second common terminal P2, and the tenth second electrode 310_4 receives the first signal having the first voltage level $V_{GL}$.

The eleventh transistor 311 has an eleventh bottom gate 311_2, an eleventh first electrode 311_3 and an eleventh second electrode 311_4, wherein the eleventh bottom gate 311_2 is electrically connected to the third input terminal In_3, the eleventh first electrode 311_3 receives the first signal having the first voltage level $V_{GL}$, and the eleventh second electrode 311_4 is electrically connected to the third common terminal P3. The twelfth transistor 312 has a twelfth bottom gate 312_2, a twelfth first electrode 312_3 and a twelfth electrode 312_4, wherein the twelfth bottom 312_2 is electrically connected to the first common terminal P1, the twelfth first electrode 312_3 receives the first signal having the first voltage level $V_{GL}$, and the twelfth second electrode 312_4 is electrically connected to the third common terminal P3. The thirteenth transistor 313 has a thirteenth bottom gate 313_2, a thirteenth first electrode 313_3 and a thirteen second electrode 313_4, wherein each of the thirteenth bottom gate 313_2 and the thirteenth second electrode 313_4 is electrically connected to the fourth input terminal In_4, and the thirteen first electrode 313_3 is electrically connected to the third common terminal P3.

In FIG. 2, the third input terminal In_3 and the fourth input terminal In_4 respectively receive a first input signal S1 and a second input signal S2, wherein the first input signal S1 and the second input signal S2 have a phase difference of 180 degrees. Because the first input signal S1 and the second input signal S2 have a phase difference of 180 degrees, the second input signal S2 is a low level signal when the first input signal S1 is a high level signal; when the second input signal S2 is a high level signal, the first input signal S1 is a low level signal, and the characteristics of these two signals exchange after a predetermined period.

For example, when the period is one second, the first input signal S1 is a high level signal and the second input signal S2 is a low level signal during the first period. If the first input signal S1 and the second input signal S2 change levels every period, then the first input signal S1 is the low level signal, and the second input signal S2 is the high level signal in a second period adjacent to the first period. Due to this characteristic, the pull-down circuit M21 works as follows: when the first transistor 301 and the second transistor 302 are in an on-state, i.e., the first input signal S1 is the high level signal and the second input signal S2 is the low level signal, the third transistor 303 and the fourth transistor 304 are in an off-state. On the contrary, when the third transistor 303 and the fourth transistor 304 are in the on-state, i.e., the second input signal S2 is the high level signal and the first input signal is the low level signal, the first transistor 301 and the second transistor 302 is in the off-state. The benefit of this design can prolong the operating life of the shift register 3a.

Figure 3:
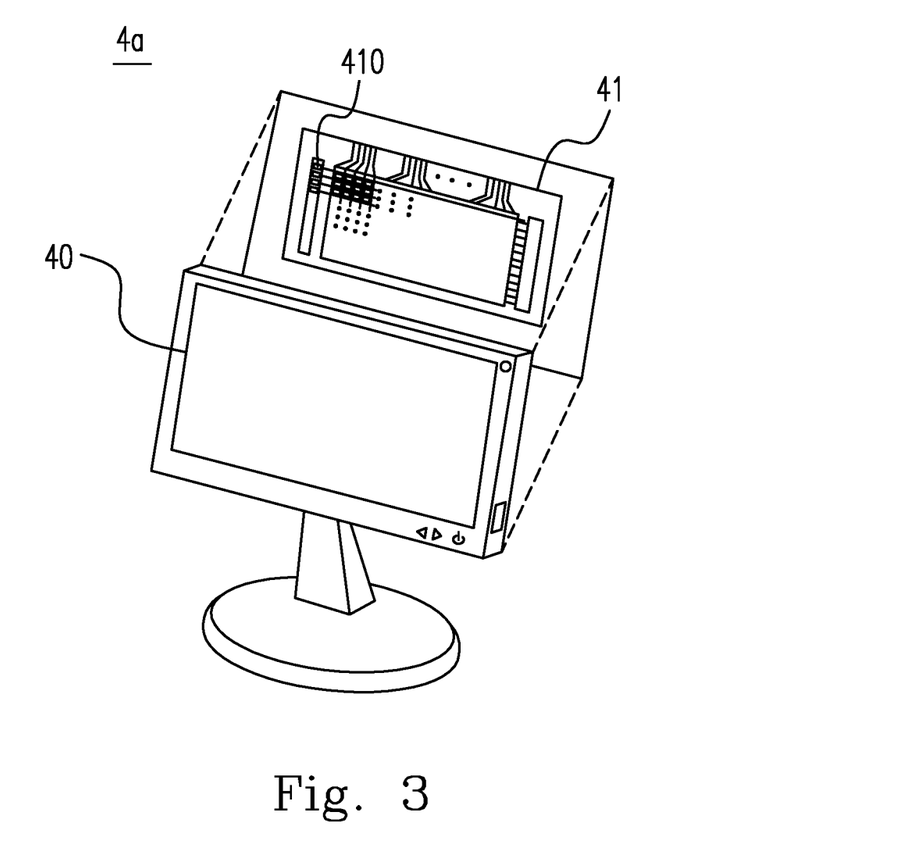
FIG. 3 shows a display device according to the preferred embodiment of the present disclosure.

Please refer to FIG. 3, which shows a display device 4a according to the preferred embodiment of the present disclosure. The display device 4a includes a display panel 40 and a shift register device 41. The shift register device 41 is used to drive the display panel 40, and the shift register device 41 includes at least one shift register 410.

In FIG. 3, the display device 4a is produced according to the present invention, i.e., the shift register 410 of the present invention can be integrated into every kind of LCD display device. The display device 4a produced according to the above preferred embodiments has a longer operating life, and the shift register 410 has better reliability and stability.

Figure 4A:
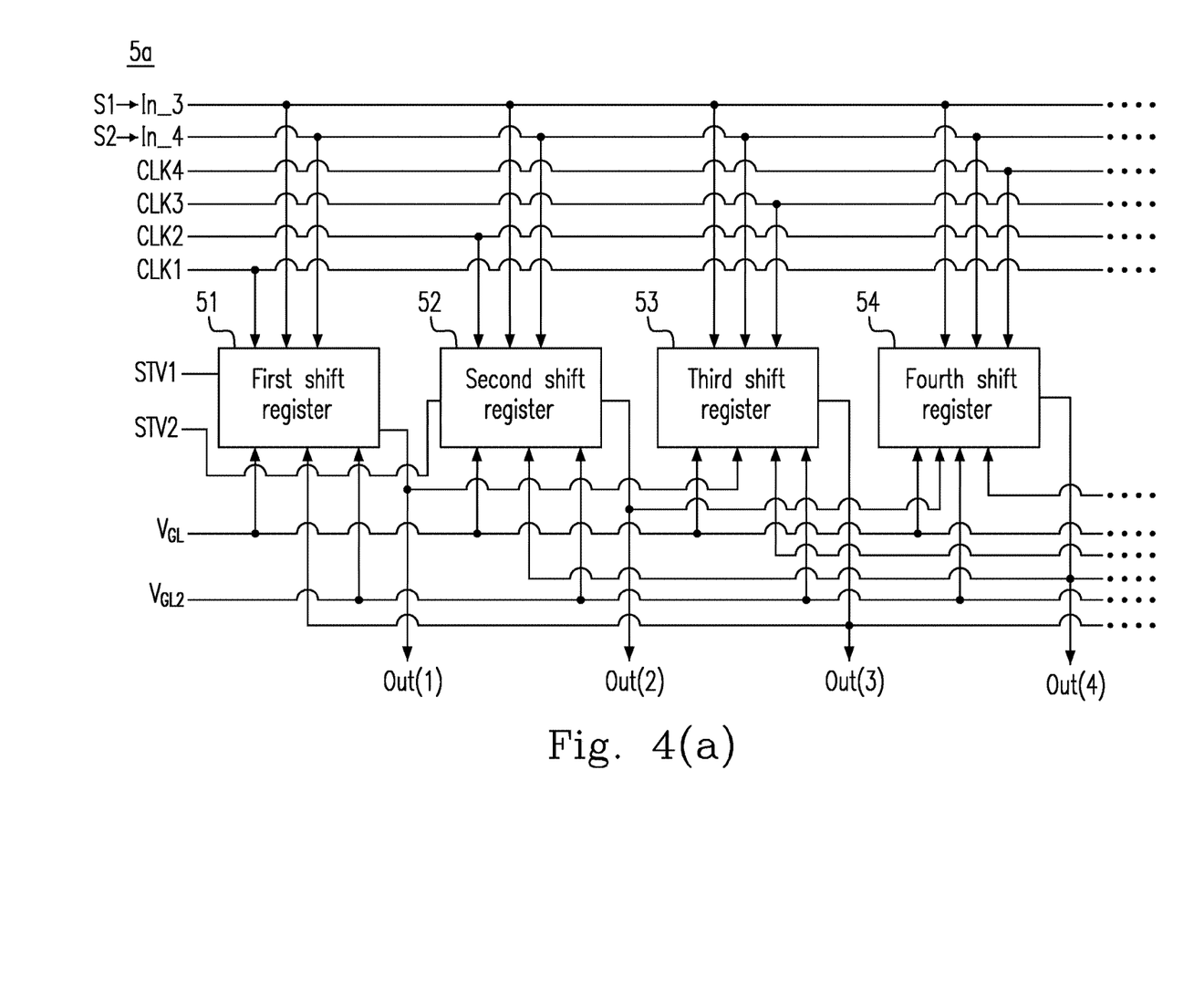

Please refer to FIG. 4(a), which shows a shift register set 5a according to the preferred embodiment of the present disclosure. The shift register set 5a includes a first shift register 51, a second shift register 52, a third shift register 53 and a fourth shift register 54. The first shift register 51 receives a first starting signal STV1, a first clock signal CLK1, an output signal of a third output terminal Out(3), the first signal having the first voltage level $V_{GL}$, the second signal having the second voltage level $V_{GL2}$, the first input signal S1 received at the third input terminal In_3 and the second input signal S2 received at the fourth input terminal In_4, and the shift register 51 generates an output signal of a first output terminal Out(1) according to the first starting signal STV1, the first clock signal CLK1, the output signal of the third output terminal Out(3), the first signal having the first voltage level $V_{GL}$, the second signal having the second voltage level $V_{GL2}$, the first input signal S1 and the second input signal S2.

In FIG. 4(a), the second shift register 52 receives the second starting signal STV2, a second clock signal CLK2, the first input signal S1, the second input signal S2, the first signal having the first voltage level $V_{GL}$, the second signal having the second voltage level $V_{GL2}$ and a fourth output signal of a fourth output terminal Out(4), and the second shift register 52 generates an output signal of a second output terminal Out(2) according to the second starting signal STV2, the second clock signal CLK2, the first input signal S1, the second input signal S2, the first signal having the first voltage level $V_{GL}$, the second signal having the second voltage level $V_{GL2}$ and the fourth output signal of the fourth output terminal Out(4). The third shift register 53 receives the output signal of the first output terminal Out(1), a third clock signal CLK3, the first input signal S1, the second input signal S2, the first signal having the first voltage level $V_{GL}$, the second signal having the second voltage level $V_{GL2}$ and an output signal of a second next stage thereof (not shown), and the third shift register 53 generates the output signal of the third output terminal Out(3) according to the output signal of the first output terminal Out(1), the third clock signal CLK3, the first input signal S1, the second input signal S2, the first signal having the first voltage level $V_{GL}$, the second signal having the second voltage level $V_{GL2}$ and the output signal of the second next stage thereof (not shown). The fourth shift register 54 receives the output signal of the second output terminal Out(2), the fourth clock signal CLK4, the first signal having the first voltage level $V_{GL}$, the second signal having the second voltage level $V_{GL2}$, the first input signal S1, the second input signal S2 and an output signal of a second next stage thereof (not shown), and the fourth shift register 54 generates the output signal of the fourth output terminal Out(4) according to the output signal of the second output terminal Out(2), the fourth clock signal CLK4, the first signal having the first voltage level $V_{GL}$, the second signal having the second voltage level $V_{GL2}$, the first input signal S1, the second input signal S2 and an output signal of the second next stage thereof (not shown).

Figure 4B:
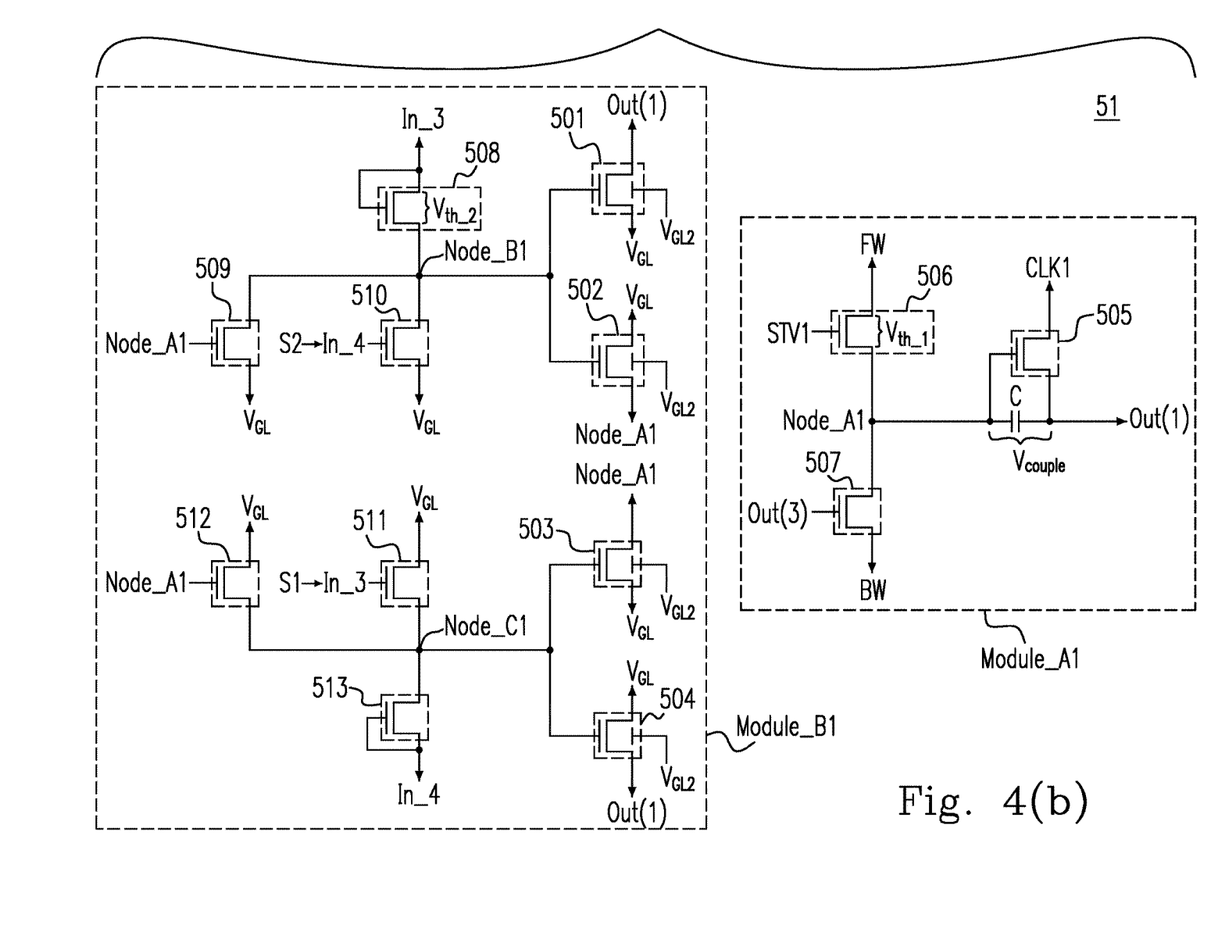

Please refer to FIG. 4(b), which shows the first shift register 51 according to the preferred embodiment of the present disclosure. The first shift register 51 includes a first primary circuit Module_A1 and a first secondary circuit Module_B1. The first primary circuit Module_A1 includes a fifth transistor 505, a sixth transistor 506, a seventh transistor 507, the first output terminal Out(1) and the capacitor C, wherein the sixth transistor 506 has a first threshold voltage $V_{th\_1}$, and the capacitor C has a coupling voltage $V_{couple}$. The first primary circuit Module_A1 is electrically connected to the first secondary circuit Module_B1 through a first node Node_A1.

In FIG. 4(b), the first secondary circuit Module_B1 includes a first transistor 501, a second transistor 502, a third transistor 503, a fourth transistor 504, an eighth transistor 508, a ninth transistor 509, a tenth transistor 510, an eleventh transistor 511, a twelfth transistor 512 and a thirteenth transistor 513, wherein the eighth transistor 508 has a second threshold voltage $V_{th\_2}$. The first primary circuit Module_A1 receives the first starting signal STV1, the output signal of the third output terminal Out(3) and the first clock signal CLK1, wherein the first secondary circuit Module_B1 has a second node Node_B1 and a third node Node_C1 of the first shift register 51, the first secondary circuit Module_B1 receives the first input signal S1 through the third input terminal In_3 and receives the second input signal S2 through the fourth input terminal In_4.

Figure 4C:
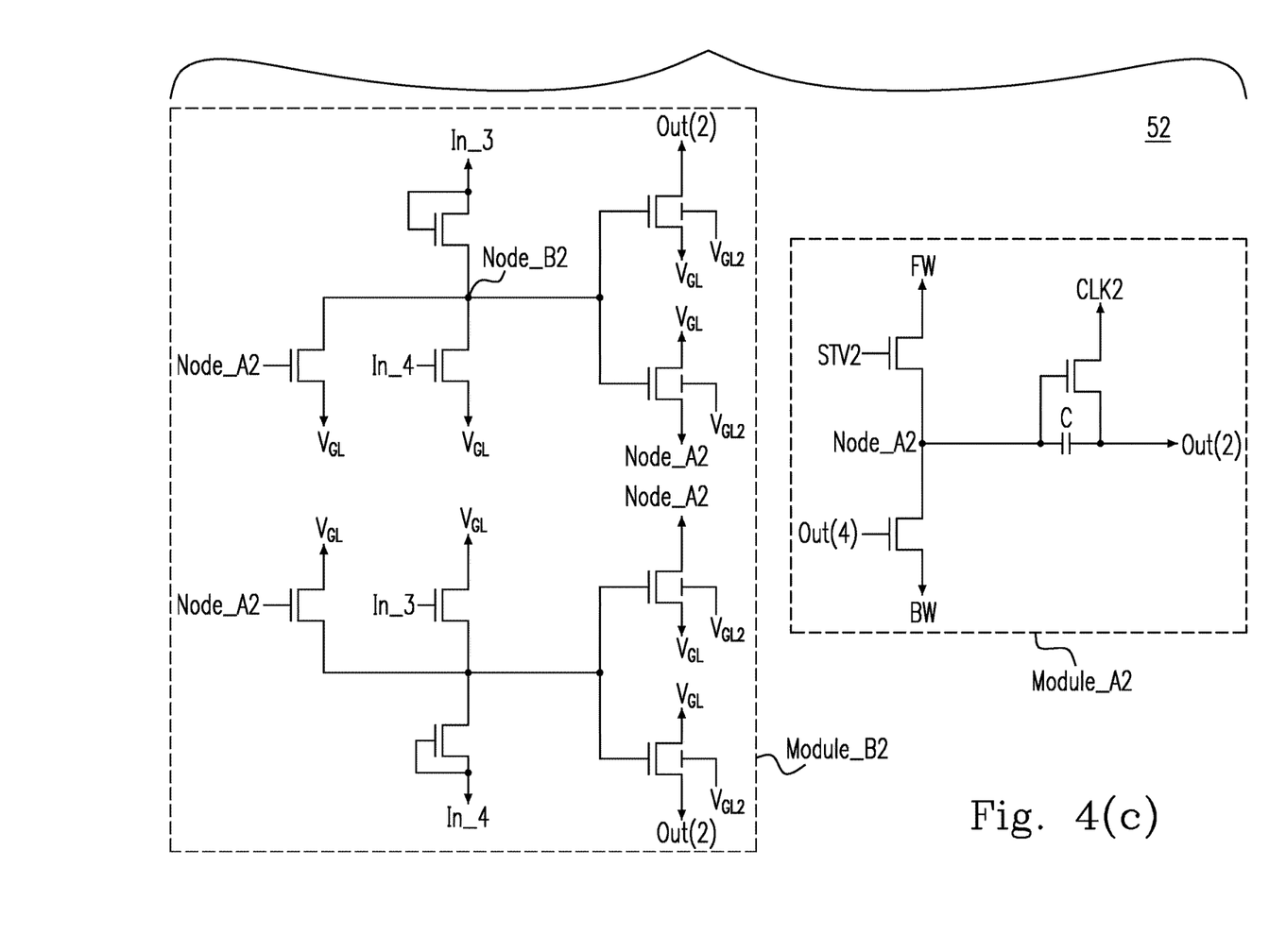

Please refer to FIG. 4(c), which shows a second shift register 52 according to the preferred embodiment of the present disclosure. The second shift register 52 includes a second primary circuit Module_A2 and a second secondary circuit Module_B2. The second primary circuit Module_A2 is electrically connected to the second secondary circuit Module_B2 through a first node Node_A2 of the second shift register 52, and has the second output terminal Out(2). The second primary circuit Module_A2 receives the second starting signal STV2, the output signal of the fourth output terminal Out(4) and the second clock signal CLK2, wherein the second secondary circuit Module_B2 has a second node Node_B2 of the second shift register 52.

Figure 4D:
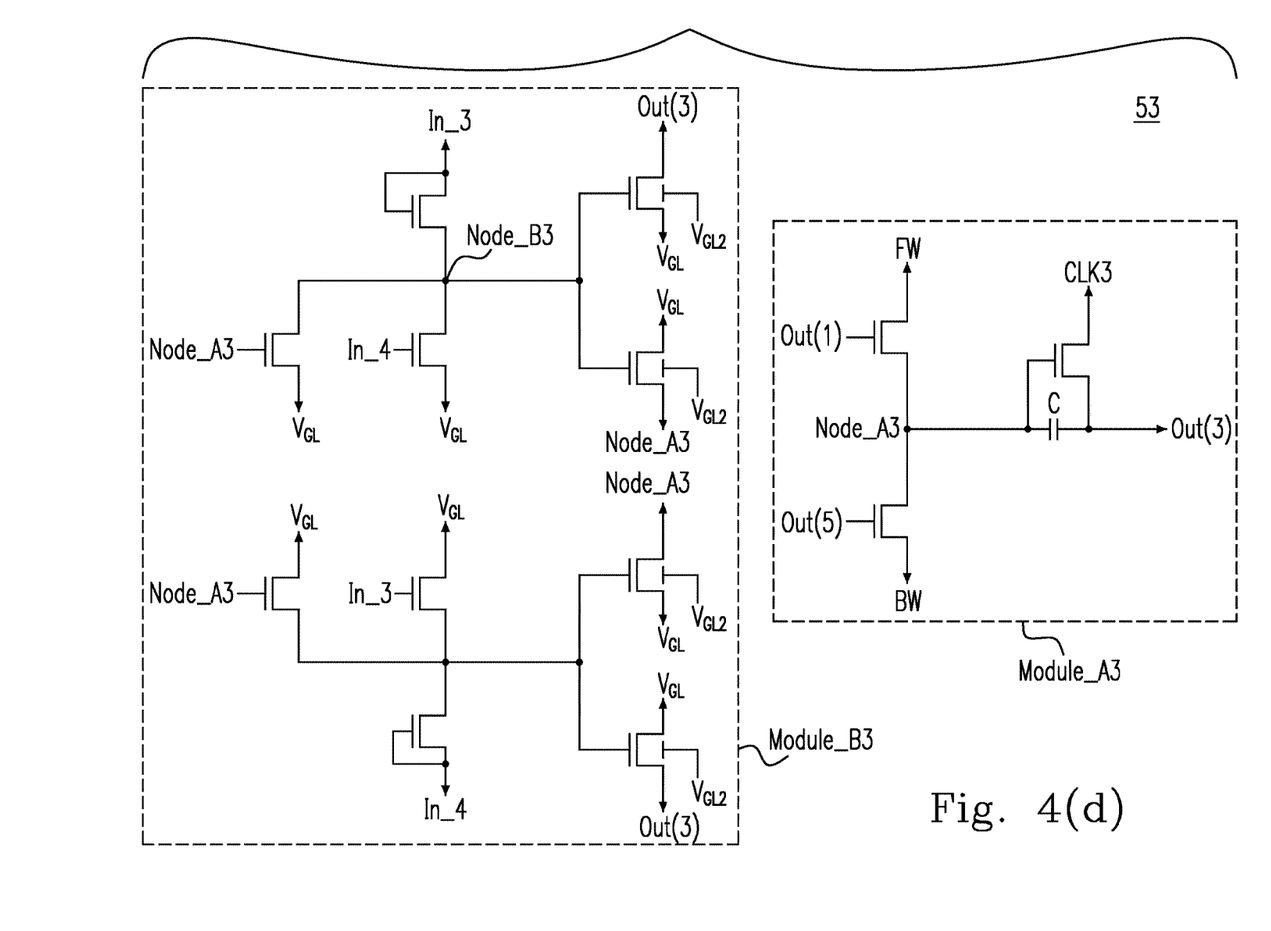

Please refer to FIG. 4(d), which shows a third shift register 53 according to the preferred embodiment of the present disclosure. The third shift register 53 includes a third primary circuit Module_A3 and a third secondary circuit Module_B3. The third primary circuit Module_A3 is electrically connected to the third secondary circuit Module_B3 through a third node Node_A3 of the third shift register 53, and has the third output terminal Out(3). The third primary circuit Module_A3 receives the output signal of the first output terminal Out(1), the output signal of the fifth output terminal Out(5), and the third clock signal CLK3, wherein the third secondary circuit Module_B3 has a second node Node_B3 of the third shift register 53.

Figure 4E:
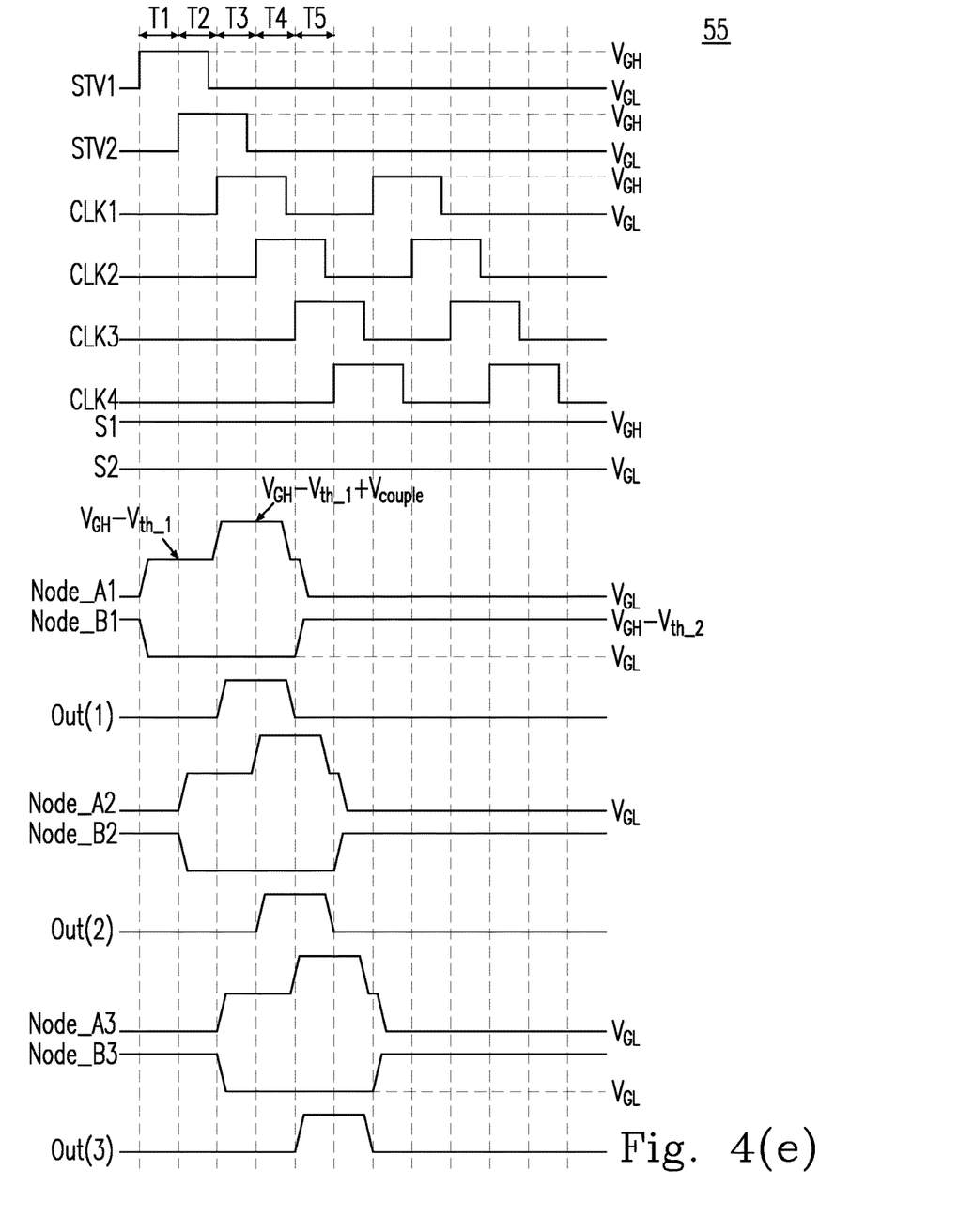

Please refer to FIGS. 4(b) and 4(e), wherein FIG. 4(e) shows a driving wave set 55 according to the preferred embodiment of the present disclosure. As shown in FIG. 4(e), the driving wave set 55 includes waveforms, which are generated when the shift register set 5a is operated under a condition including a first sub-condition and a second sub-condition. The first sub-condition is that the third input terminal In_3 receives a bias voltage having a voltage level $V_{GH}$, and the second sub-condition is that the fourth input terminal In_4 receives a bias voltage having the first low level $V_{GL}$; i.e., the first input signal S1 is a high voltage level signal having the high voltage level $V_{GH}$, and the second input signal S2 is a low voltage level signal having the first low voltage level $V_{GL}$.

As shown in FIGS. 4(b) and 4(e), during a period from a first period T1 to a second period T2, the first starting signal STV1 is inputted into the gate of the sixth transistor 506 of the first shift register 51 to turn on the sixth transistor 506. Because the voltage level of the forward bias voltage FW is equal to the high voltage level $V_{GH}$ and the sixth transistor 506 has the first threshold voltage $V_{th\_1}$, the voltage of the first node Node_A1 of the first shift register 51 is equal to $V_{GH}-V_{th\_1}$. Because the first node Node_A1 of the first shift register 51 has the high voltage level, the fifth transistor 505 is turned on. During a period from a third period T3 to a fourth period T4, the first clock signal CLK1 (being in the high voltage level) is input into the fifth transistor 505, the fifth transistor 505 is turned on to transmit the high voltage level of the first clock signal CLK1 to a terminal of the capacitor C, and therefore the coupling voltage $V_{couple}$ is generated at the first node Node_A1 of the first shift register 51. Because the coupling voltage is generated during the period from the third period T3 to the fourth period T4, the voltage level change of the first node Node_A1 of the first shift register 51 is equal to $V_{GH}-V_{th\_1}+V_{couple}$.

The first primary circuit Module_A1 of the first shift register 51 receives the first clock signal CLK1 during the third period T3, and generates a first output signal at the first output terminal Out(1); the second primary circuit Module_A2 of the second shift register 52 receives the second clock signal CLK2 during the fourth period T4, and generates a second output signal at the second output terminal Out(2); and the third primary circuit Module_A3 of the third shift register 53 receives the third clock signal CLK3 during the fifth period T5, and generates a third output signal at the third output terminal Out(3).

In FIGS. 4(b) and 4(e), during a period from the first period T1 to the fourth period T4, when the voltage level of the first node Node_A1 of the first shift register 51 is high enough, the ninth transistor 509 is turned on, and the second node Node_B1 of the first register 51 is conducted to have the first low voltage level $V_{GL}$. During a fifth period T5, the high voltage level signal of the third output terminal Out(3) is input into the gate of the seventh transistor 507, the first node Node_A1 of the first shift register 51 is conducted to have the first low voltage level $V_{GL}$ (i.e., the reverse bias voltage BW), the ninth transistor 509 of the first node Node_A1 is turned off, the eighth transistor 508 conducts the third input terminal In_3 and the second node Node_B1 of the first shift register 51, so the second node Node_B1 and the third input terminal In_3 are electrically connected and are at the high voltage level. In addition, the eighth transistor 508 has the second threshold voltage $V_{th\_2}$, and therefore the voltage level of the second node Node_B1 of the first shift register 51 is equal to $V_{GH}-V_{th\_2}$.

In FIGS. 4(b) and 4(e), because the bias voltage at the third input terminal In_3 is provided to be equal to the voltage level $V_{GH}$ and the bias voltage at the fourth input terminal In_4 is provided to be equal to the first low voltage level $V_{GL}$, the eighth transistor 508 is turned on to cause the second node Node_B1 of the first shift register 51 to have the high voltage level, thereby causing the first transistor 501 and the second transistor 502 to turn on. Meanwhile, the eleventh transistor 511 is turned on to transmit the first low voltage level $V_{GL}$ to the third node Node_C1 of the first shift register 51, thereby causing the third transistor 503 and the fourth transistor 504 to turn off. Under this situation, the first primary circuit Module_A1 is discharged and regulated by using the first transistor 501, the second transistor 502, the eighth transistor 508, the ninth transistor 509 and the tenth transistor 510, thereby causing the first node Node_A1 of the first shift register 51 to remain at the first low voltage level $V_{GL}$, i.e., maintain the voltage level.

After a predetermined period, the polarity of the third input terminal In_3 and the fourth input terminal In_4 exchange, i.e., the bias voltage at the third input terminal In_3 is provided to be equal to the first low voltage level $V_{GL}$, and the bias voltage at the fourth input terminal In_4 is provided to be equal to the high voltage level $V_{GH}$. Under this situation, the eighth transistor 508 is turned off, and the tenth transistor 510 is turned on, thereby causing the second node Node_B1 of the first shift register 51 to have the first low voltage level $V_{GL}$. Meanwhile, the eleventh transistor 511 is turned off and the thirteenth transistor 513 is turned on to transmit the high voltage level $V_{GH}$ to the third node Node_C1 of the first shift register 51, thereby causing the third transistor 503 and the fourth transistor 504 to turn on. Under this situation, the first primary circuit Module_A1 is discharged and regulated by using the third transistor 503, the fourth transistor 504, the eleventh transistor 511, the twelfth transistor 512 and the thirteenth transistor 513, thereby causing the first node Node_A1 of the first shift register 51 to remain at the first low voltage level $V_{GL}$, i.e., maintain the voltage level. The operation mode of each of the second shift register 52 and the third shift register 53 is similar to that of the first shift register 51, so please refer to the above demonstrations, as they are not described again here.

It is worth mentioning that as the terminal end applications for smart phones and the tablet computers bloom, the requirement of the high resolution panels over 250 pixels per inch (ppi) gradually become a trend, and therefore the panel factories are aggressively engaging in research into metal oxide semiconductors. At the present time, the amorphous Indium Gallium Zinc Oxide (a-IGZO) technology is more sophisticated. In the aforementioned embodiments, any one of the first transistor, the second transistor, the third transistor, the fourth transistor, the fifth transistor, the sixth transistor, the seventh transistor, the eighth transistor, the ninth transistor, the tenth transistor, the eleventh transistor, the twelfth transistor and the thirteenth transistor can be the Indium Gallium Zinc Oxide TFT.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A display device, comprising:
   a display panel; and
   a shift register device configured to drive the display panel, and including at least one shift register unit including:
   a primary circuit having an output terminal, a first and a second input terminals, and a first common terminal; and
   a secondary circuit electrically connected to the first common terminal, and including:
   an inverting circuit; and
   a pull-down circuit electrically connected to the inverting circuit, and including:
   a first transistor having a first top gate, a first bottom gate, a first first electrode and a first second electrode;
   a second transistor having a second top gate, a second bottom gate, a second first electrode and a second second electrode;
   a third transistor having a third top gate, a third bottom gate, a third first electrode and a third second electrode; and
   a fourth transistor having a fourth top gate, a fourth bottom gate, a fourth first electrode and a fourth second electrode, wherein:
   the pull-down circuit has a second and a third common terminals;
   the first and the second bottom gates are electrically connected to the second common terminal; and
   the third and the fourth bottom gates are electrically connected to the third common terminal.

2. The display device as in claim 1, wherein:
   the first first electrode and the fourth second electrode are electrically connected to the output terminal; and
   the second second electrode and the third first electrode are electrically connected to the first common terminal.

3. The display device as in claim 1, wherein:
   the first second electrode, the second first electrode, the third second electrode and the fourth first electrode are configured to receive a first signal having a first voltage level; and
   the first top gate, the second top gate, the third top gate and the fourth top gate are configured to receive a second signal having a second voltage level.

4. The display device as in claim 1, wherein the primary circuit further includes a pull-up circuit including:
   a fifth transistor having a fifth bottom gate, a fifth first electrode and a fifth second electrode, wherein the fifth bottom gate is electrically connected to the first common terminal, the fifth first electrode receives a clock signal, and the fifth second electrode is electrically connected to the output terminal; and
   a capacitor having a first and a second connecting terminals, wherein the first connecting terminal is electrically connected to the output terminal, and the second connecting terminal is electrically connected to the first common terminal.

5. The display device as in claim 4, wherein:
   the primary circuit further includes:
   a sixth transistor having a sixth bottom gate, a sixth first electrode and a sixth second electrode, wherein the sixth bottom gate is electrically connected to the first input terminal, the sixth first electrode receives a forward bias voltage, and the sixth second electrode is electrically connected to the first common terminal; and
   a seventh transistor having a seventh bottom gate, a seventh first electrode and a seventh second electrode, wherein the seventh bottom gate is electrically connected to the second input terminal, the seventh first electrode is electrically connected to the first common terminal, and the seventh second electrode receives a reverse bias voltage.

6. The display device as in claim 5, wherein:
the inverting circuit has a third and a fourth input terminals;
the inverting circuit further includes:
an eighth transistor having an eighth bottom gate, an eighth first electrode, an eighth second electrode, wherein the eighth bottom gate and the eighth first electrode are electrically connected to the third input terminal, and the eighth second electrode is electrically connected to the second common terminal;
a ninth transistor having a ninth bottom gate, a ninth first electrode and a ninth second electrode, wherein the ninth bottom gate is electrically connected to the first common terminal, the ninth first electrode is electrically connected to the second common terminal, and the ninth second electrode is configured to receive a first signal having a first voltage level; and
a tenth transistor having a tenth bottom gate, a tenth first electrode and a tenth second electrode, wherein the tenth bottom gate is electrically connected to the fourth input terminal, the tenth first electrode is electrically connected to the second common terminal, and the tenth second electrode is configured to receive the first voltage level.

7. The display device as in claim 6, wherein the inverting circuit further includes:
an eleventh transistor having an eleventh bottom gate, an eleventh first electrode and an eleventh second electrode, wherein the eleventh bottom gate is electrically connected to the third input terminal, the eleventh first electrode is configured to receive the first voltage level, and the eleventh second electrode is electrically connected to the third common terminal;
a twelfth transistor having a twelfth bottom gate, a twelfth first electrode and a twelfth second electrode, wherein the twelfth bottom gate is electrically connected to the first common terminal, the twelfth first electrode is configured to receive the first voltage level, and the twelfth second electrode is electrically connected to the third common terminal; and
a thirteenth transistor having an thirteenth bottom gate, a thirteenth first electrode and a thirteenth second electrode, wherein the thirteenth bottom gate and the thirteenth second electrode are electrically connected to the fourth input terminal, and the thirteenth first electrode is electrically connected to the third common terminal.

8. A shift register, comprising:
a primary circuit having an output terminal, a first and a second input terminals, and a first common terminal; and
a secondary circuit electrically connected to the first common terminal, and including:
an inverting circuit; and
a pull-down circuit electrically connected to the inverting circuit, and including:
a first transistor having a first top gate, a first bottom gate, a first first electrode and a first second electrode;
a second transistor having a second top gate, a second bottom gate, a second first electrode and a second second electrode;
a third transistor having a third top gate, a third bottom gate, a third first electrode and a third second electrode;
a fourth transistor having a fourth top gate, a fourth bottom gate, a fourth first electrode and a fourth second electrode;
a second and a third common terminals, wherein:
the first first electrode and the fourth second electrode are electrically connected to the output terminal;
the second second electrode and the third first electrode are electrically connected to the first common terminal;
the first and the second bottom gates are electrically connected to the second common terminal;
the third and the fourth bottom gates are electrically connected to the third common terminal;
the first second electrode, the second first electrode, the third second electrode and the fourth first electrode are configured to receive a first signal having a first voltage level; and
the first top gate, the second top gate, the third top gate and the fourth top gate are configured to receive a second signal having a second voltage level.

9. The shift register as in claim 8, wherein:
the first input terminal of a specific shift register receives an input signal being one of output signals from the preceding two shift registers thereof; and
the second input terminal of the specific register receives another input signal being one of output signals from the next two shift registers thereof.

10. The shift register as in claim 9, wherein the primary circuit further includes a pull-up circuit including:
a fifth transistor having a fifth bottom gate, a fifth first electrode and a fifth second electrode, wherein the fifth bottom gate is electrically connected to the first common terminal, the fifth first electrode receives a clock signal, and the fifth second electrode is electrically connected to the output terminal;
a capacitor having a first and a second connecting terminals, wherein the first connecting terminal is electrically connected to the output terminal, and the second connecting terminal is electrically connected to the first common terminal;
a sixth transistor having a sixth bottom gate, a sixth first electrode and a sixth second electrode, wherein the sixth bottom gate is electrically connected to the first input terminal, the sixth first electrode receives a forward bias voltage, and the sixth second electrode is electrically connected to the first common terminal; and
a seventh transistor having a seventh bottom gate, a seventh first electrode and a seventh second electrode, wherein the seventh bottom gate is electrically connected to the second input terminal, the seventh first electrode is electrically connected to the first common terminal, and the seventh second electrode receives a reverse bias voltage.

11. The shift register as in claim 10, wherein the inverting circuit has a third and a fourth input terminals, and the inverting circuit further includes:
an eighth transistor having an eighth bottom gate, an eighth first electrode, an eighth second electrode, wherein the eighth bottom gate and the eighth first electrode are electrically connected to the third input terminal, and the eighth second electrode is electrically connected to the second common terminal;
a ninth transistor having a ninth bottom gate, a ninth first electrode and a ninth second electrode, wherein the ninth bottom gate is electrically connected to the first common terminal, the ninth first electrode is electrically connected to the second common terminal, and the ninth second electrode is configured to receive a first voltage level;
a tenth transistor having a tenth bottom gate, a tenth first electrode and a tenth second electrode, wherein the tenth bottom gate is electrically connected to the fourth input terminal, the tenth first electrode is electrically connected to the second common terminal, and the tenth second electrode is configured to receive the first voltage level;

an eleventh transistor having an eleventh bottom gate, an eleventh first electrode and an eleventh second electrode, wherein the eleventh bottom gate is electrically connected to the third input terminal, the eleventh first electrode is configured to receive the first voltage level, and the eleventh second electrode is electrically connected to the third common terminal;

a twelfth transistor having a twelfth bottom gate, a twelfth first electrode and a twelfth second electrode, wherein the twelfth bottom gate is electrically connected to the first common terminal, the twelfth first electrode is configured to receive the first voltage level, and the twelfth second electrode is electrically connected to the third common terminal; and a thirteenth transistor having a thirteenth bottom gate, a thirteenth first electrode and a thirteenth second electrode, wherein the thirteenth bottom gate and the thirteenth second electrode are electrically connected to the fourth input terminal, and the thirteenth first electrode is electrically connected to the third common terminal.

12. The shift register as in claim 11, wherein:
each of the transistors is an Indium Gallium Zinc oxide thin film transistor (TFT);
the third and the fourth input terminals receive the first and the second input signals respectively; and
the first input signal and the second input signal have a phase difference of 180 degrees therebetween.

13. A shift register, comprising:
a primary circuit having an output terminal, a first and a second input terminals, and a first common terminal; and
a secondary circuit electrically connected to the first common terminal, and including:
an inverting circuit; and
a pull-down circuit electrically connected to the inverting circuit and including:
a first transistor having a first top gate, a first bottom gate, a first first electrode and a first second electrode;
a second transistor having a second top gate, a second bottom gate, a second first electrode and a second second electrode;
a third transistor having a third top gate, a third bottom gate, a third first electrode and a third second electrode;
a fourth transistor having a fourth top gate, a fourth bottom gate, a fourth first electrode and a fourth second electrode;
a second common terminal; and
a third common terminal, wherein:
the first and the second bottom gates are electrically connected to the second common terminal, the first second and the second first electrodes are configured to receive a first signal having a first voltage level, the first and the second top gates are configured to receive a second signal having a second voltage level, and the second voltage level is higher than the first voltage level;
the third and the fourth bottom gates are electrically connected to the third common terminal;
the first first electrode and the fourth second electrode are electrically connected to the output terminal;
the second second electrode and the third first electrode are electrically connected to the first common terminal;
the third second electrode and the fourth first electrode are configured to receive the first voltage level; and
the third top gate and the fourth top gate are configured to receive the second voltage level.

14. The shift register as in claim 13, wherein the primary circuit further includes a pull-up circuit including:
a fifth transistor having a fifth bottom gate, a fifth first electrode and a fifth second electrode, wherein the fifth bottom gate is electrically connected to the first common terminal, the fifth first electrode receives a clock signal, and the fifth second electrode is electrically connected to the output terminal; and
a capacitor having a first and a second connecting terminals, wherein the first connecting terminal is electrically connected to the output terminal, and the second connecting terminal is electrically connected to the first common terminal;
a sixth transistor having a sixth bottom gate, a sixth first electrode and a sixth second electrode, wherein the sixth bottom gate is electrically connected to the first input terminal, the sixth first electrode receives a forward bias voltage, and the sixth second electrode is electrically connected to the first common terminal; and
a seventh transistor having a seventh bottom gate, a seventh first electrode and a seventh second electrode, wherein the seventh bottom gate is electrically connected to the second input terminal, the seventh first electrode is electrically connected to the first common terminal, and the seventh second electrode receives a reverse bias voltage.

15. The shift register as in claim 14, wherein the inverting circuit has a third and a fourth input terminals, and the inverting circuit further includes:
an eighth transistor having an eighth bottom gate, an eighth first electrode, an eighth second electrode, wherein the eighth bottom gate and the eighth first electrode are electrically connected to the third input terminal, and the eighth second electrode is electrically connected to the second common terminal;
a ninth transistor having a ninth bottom gate, a ninth first electrode and a ninth second electrode, wherein the ninth bottom gate is electrically connected to the first common terminal, the ninth first electrode is electrically connected to the second common terminal, and the ninth second electrode is configured to receive the first voltage level;
a tenth transistor having a tenth bottom gate, a tenth first electrode and a tenth second electrode, wherein the tenth bottom gate is electrically connected to the fourth input terminal, the tenth first electrode is electrically connected to the second common terminal, and the tenth second electrode is configured to receive the first voltage level;
an eleventh transistor having an eleventh bottom gate, an eleventh first electrode and an eleventh second electrode, wherein the eleventh bottom gate is electrically connected to the third input terminal, the eleventh first electrode is configured to receive the first voltage level, and the eleventh second electrode is electrically connected to the third common terminal;
a twelfth transistor having a twelfth bottom gate, a twelfth first electrode and a twelfth second electrode, wherein the twelfth bottom gate is electrically connected to the first common terminal, the twelfth first electrode is configured to receive the first voltage level, and the twelfth second electrode is electrically connected to the third common terminal; and a thirteenth transistor having a thirteenth bottom gate, a thirteenth first electrode and a thirteenth second electrode, wherein the thirteenth bottom gate and the thirteenth second electrode are electrically connected to the fourth input terminal, and the thirteenth first electrode is electrically connected to the third common terminal.

16. The shift register as in claim 13, wherein:
the first input terminal of a specific register receives an input signal being one of output signals from the preceding two registers thereof;
the second input terminal of the specific register receives another input signal being one of output signals from the next two registers thereof; and
each of the transistors is an Indium Gallium Zinc oxide thin film transistor (TFT).

* * * * *